United States Patent
Miyashita et al.

(10) Patent No.: US 10,388,843 B2
(45) Date of Patent: Aug. 20, 2019

(54) HONEYCOMB SANDWICH STRUCTURE AND METHOD OF MANUFACTURING HONEYCOMB SANDWICH STRUCTURE

(71) Applicant: MITSUBISHI ELECTRIC CORPORATION, Chiyoda-ku (JP)

(72) Inventors: Masahiro Miyashita, Chiyoda-ku (JP); Kazushi Sekine, Chiyoda-ku (JP); Hiroki Kobayashi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 161 days.

(21) Appl. No.: 15/504,577

(22) PCT Filed: Aug. 20, 2015

(86) PCT No.: PCT/JP2015/073355
§ 371 (c)(1),
(2) Date: Feb. 16, 2017

(87) PCT Pub. No.: WO2016/031667
PCT Pub. Date: Mar. 3, 2016

(65) Prior Publication Data
US 2017/0244018 A1   Aug. 24, 2017

(30) Foreign Application Priority Data
Aug. 29, 2014 (JP) .................. 2014-175338

(51) Int. Cl.
*H01L 35/30* (2006.01)
*B32B 3/12* (2006.01)
(Continued)

(52) U.S. Cl.
CPC .............. *H01L 35/30* (2013.01); *B32B 3/12* (2013.01); *B64G 1/42* (2013.01); *B64G 1/50* (2013.01);
(Continued)

(58) Field of Classification Search
CPC ....................................................... H01L 35/30
See application file for complete search history.

(56) References Cited

U.S. PATENT DOCUMENTS

| 5,715,684 A | 2/1998 | Watanabe et al. |
| 6,574,967 B1 | 6/2003 | Park et al. |
(Continued)

FOREIGN PATENT DOCUMENTS

| EP | 2 362 457 A2 | 8/2011 |
| JP | 8-136106 A | 5/1996 |
(Continued)

OTHER PUBLICATIONS

International Search Report dated Nov. 17, 2015, in PCT/JP2015/073355 filed Aug. 20, 2015.

*Primary Examiner* — Eli S Mekhlin
(74) *Attorney, Agent, or Firm* — Oblon, McClelland, Maier & Neustadt, L.L.P.

(57) ABSTRACT

A honeycomb sandwich structure includes a main body portion having a first skin material, a second skin material, and a honeycomb core sandwiched between the first skin material and the second skin material, and a thermoelectric conversion module that generates power using a temperature difference between a high temperature side module front surface and a low temperature side module rear surface. The thermoelectric conversion module is embedded in a main body portion such that at least one of the module front surface and the module rear surface is in a state being exposed from the main body portion, and as a result, a temperature difference is generated between the module front surface and the module rear surface.

20 Claims, 10 Drawing Sheets

(51) Int. Cl.
 *B64G 1/42* (2006.01)
 *B64G 1/50* (2006.01)
 *H01L 35/32* (2006.01)
 *H01L 35/34* (2006.01)
 *H02N 11/00* (2006.01)

(52) U.S. Cl.
 CPC .............. *H01L 35/32* (2013.01); *H01L 35/34* (2013.01); *H02N 11/00* (2013.01); *B32B 2457/00* (2013.01)

(56) References Cited

U.S. PATENT DOCUMENTS

| | | | |
|---|---|---|---|
| 2004/0094192 A1* | 5/2004 | Luo | .......................... H01L 35/30 136/203 |
| 2006/0086118 A1 | 4/2006 | Venkatasubramanian et al. | |
| 2011/0209737 A1 | 9/2011 | Konkle, Jr. | |
| 2015/0214461 A1 | 7/2015 | Kurihara et al. | |
| 2016/0316565 A1* | 10/2016 | Chen | ....................... H05K 1/185 |

FOREIGN PATENT DOCUMENTS

| | | |
|---|---|---|
| JP | 8-242022 A | 9/1996 |
| JP | 11-217100 A | 8/1999 |
| JP | 2003-21424 A | 1/2003 |
| JP | 2003-229606 A | 8/2003 |
| JP | 2012-1013 A | 1/2012 |
| WO | WO 2014/064755 A1 | 5/2014 |

* cited by examiner

HONEYCOMB SANDWICH STRUCTURE AND METHOD OF MANUFACTURING HONEYCOMB SANDWICH STRUCTURE

TECHNICAL FIELD

This invention relates to a honeycomb sandwich structure having a thermoelectric conversion module formed including a plurality of thermoelectric conversion elements, and a method of manufacturing the honeycomb sandwich structure.

BACKGROUND ART

Recent years have witnessed a growing need for increased power in a satellite bus so that a mounted device such as a large communication device can be mounted on the satellite bus. The power of a satellite bus can be increased by improving the conversion efficiency of a photovoltaic cell and the charging/discharging efficiency of a battery. Moreover, a power generation technique employing a thermoelectric conversion module that can generate power using a temperature difference between a high temperature side module front surface and a low temperature side module rear surface has come to attention as a method of increasing the power of a satellite bus (see PTL 1, for example).

More specifically, PTL 1 discloses a technique in which a thermoelectric conversion module is adhered to a heat dissipating surface of a spacecraft so as to generate power using a temperature difference between a high temperature side module front surface contacting the heat dissipating surface and a low temperature side module rear surface contacting cold air from outer space, outer space being an ultra-low temperature environment. PTL 1 also discloses a technique in which the thermoelectric conversion module is adhered to a mounted device attachment surface of the spacecraft so as to generate power using a temperature difference between the high temperature side module front surface, which contacts a mounted device that generates heat when operative, and the low temperature side module rear surface, which contacts a panel main body.

CITATION LIST

Patent Literature

[PTL 1] Japanese Patent Application Publication No. H11-217100

Non Patent Literature

[NPL 1] Komatsu Ltd., press release, ["Renewable energy effective in reducing CO2", Developing and selling the most efficient thermoelectric conversion module in the world (*1)], [online], Jan. 27, 2009, [search performed on Aug. 4, 2014], Internet URL: http://www.komatsu.co.jp/CompanyInfo/press/20090127134421026622.html

SUMMARY OF INVENTION

Technical Problem

However, the prior art includes the following problem.

In the prior art described in PTL 1, when the thermoelectric conversion module is adhered to the heat dissipating surface of the spacecraft or the mounted device attachment surface of the spacecraft, the thermoelectric conversion module is adhered directly onto skin material. As a result, the thermoelectric conversion module may peel away from the skin material in response to an external impact.

This invention has been designed to solve this problem, and an object thereof is to obtain a honeycomb sandwich structure and a method thereof with which a thermoelectric conversion module can be prevented from peeling away from skin material in response to an external impact.

Solution to Problem

A honeycomb sandwich structure according to this invention includes a main body portion having a first skin material that includes a first front surface and a first rear surface opposing the first front surface, a second skin material that includes a second front surface and a second rear surface opposing the second front surface, and a honeycomb core that is adhered to both the first rear surface and the second rear surface so as to be sandwiched between the first skin material and the second skin material, and a thermoelectric conversion module that includes a high temperature side module front surface and a low temperature side module rear surface opposing the module front surface, and generates power using a temperature difference between the module front surface and the module rear surface, wherein the thermoelectric conversion module is embedded in the main body portion such that at least one of the module front surface and the module rear surface is in a state of being exposed from the main body portion, thereby generating the temperature difference.

Further, a method of manufacturing a honeycomb sandwich structure according to this invention is used to manufacture a honeycomb sandwich structure including a main body portion having a first skin material that includes a first front surface and a first rear surface opposing the first front surface, a second skin material that includes a second front surface and a second rear surface opposing the second front surface, and a honeycomb core that is adhered to both the first rear surface and the second rear surface so as to be sandwiched between the first skin material and the second skin material, and a thermoelectric conversion module that includes a high temperature side module front surface and a low temperature side module rear surface opposing the module front surface, and generates power using a temperature difference between the module front surface and the module rear surface, the method including: an embedding hole forming step for forming an embedding hole for embedding the thermoelectric conversion module in the main body portion such that at least one of the module front surface and the module rear surface is in a state of being exposed from the main body portion, thereby generating the temperature difference, and a thermoelectric conversion module disposing step for disposing the thermoelectric conversion module in the embedding hole and fixing a position of the disposed thermoelectric conversion module.

Advantageous Effects of Invention

According to this invention, the thermoelectric conversion module is embedded in the main body portion of the honeycomb sandwich structure such that at least one of the module front surface and the module rear surface is in a state being exposed from the main body portion, whereby a temperature difference is generated between the module front surface and the module rear surface. It is therefore possible to obtain a honeycomb sandwich structure and a method of manufacturing a honeycomb sandwich structure with which a thermoelectric conversion module can be prevented from peeling away from skin material in response to an external impact.

DESCRIPTION OF EMBODIMENTS

Figure 1:
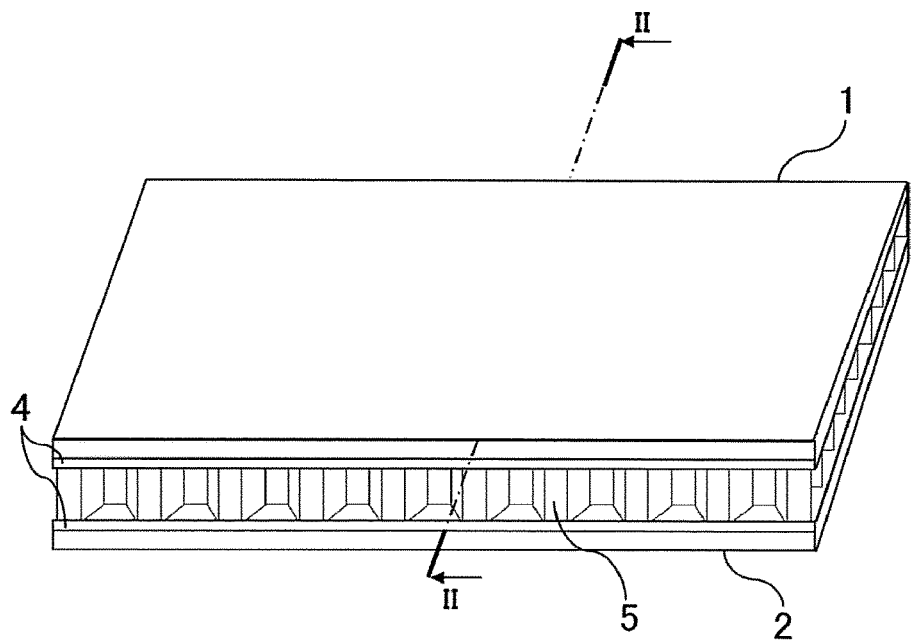
FIG. 1 is a perspective view showing a honeycomb sandwich structure according to a first embodiment of this invention.

Preferred embodiments of a honeycomb sandwich structure and a method of manufacturing a honeycomb sandwich structure according to this invention will be described below using the drawings. Note that in the description of the drawings, identical reference numerals have been allocated to identical elements, and duplicate description thereof has been omitted. Further, specific numerical values and the like indicated in the embodiments are merely examples, and do not affect the scope of the invention.

Furthermore, in the honeycomb sandwich structure according to this invention, a thermoelectric conversion module is embedded in a main body portion such that at least one of a module front surface and a module rear surface is in a state of being exposed from the main body portion, whereby a temperature difference is generated between the module front surface and the module rear surface. Specific examples of this configuration will be described in the respective embodiments.

First Embodiment

First, effects obtained with a honeycomb sandwich structure according to a first embodiment will be described. As noted above, with the honeycomb sandwich structure according to the first embodiment, an effect (referred to hereafter as a first effect) wherein the thermoelectric conversion module can be prevented from peeling away from skin material in response to an external impact is realized.

Moreover, with the honeycomb sandwich structure according to the first embodiment, a further effect (referred to hereafter as a second effect) can be obtained in addition to the first effect. The second effect will be described by comparing the honeycomb sandwich structure according to the first embodiment with a honeycomb sandwich structure to which the prior art has been applied.

In the prior art described in PTL 1, when the thermoelectric conversion module is adhered to the heat dissipating surface of the spacecraft, the thermoelectric conversion module generates power in a condition where the temperature of the low temperature side module rear surface corresponds to approximately −170° C., i.e. the temperature of cold air from outer space.

When the thermoelectric conversion module is adhered to the mounted device attachment surface of the spacecraft, on the other hand, the thermoelectric conversion module generates power in a condition where the temperature of the low temperature side module rear surface corresponds to the temperature of the main body panel.

Here, the temperature (approximately −170° C.) of cold air from outer space is not typically included within an operating temperature range in which the performance of the thermoelectric conversion module can be maximized. For example, a thermoelectric conversion module described in NPL 1, which is formed using a BiTe-based material, reaches the highest known level of thermoelectric conversion efficiency in the world as of January 2009 when the temperature of the low temperature side module rear surface corresponds to 30° C. Therefore, when this type of thermoelectric conversion module is used, greater thermoelectric conversion efficiency can be expected in a case where the thermoelectric conversion module is adhered to the mounted device attachment surface of the spacecraft rather than the heat dissipating surface of the spacecraft.

However, when the thermoelectric conversion module is adhered to the mounted device attachment surface of the spacecraft in order to improve the thermoelectric conversion efficiency, a load of the mounted device is exerted entirely on the thermoelectric conversion module. As a result, the thermoelectric conversion module is easily damaged, and may ultimately malfunction.

Hence, with the prior art described in PTL 1, it is impossible to improve the thermoelectric conversion efficiency of the thermoelectric conversion module while also preventing the thermoelectric conversion module from being damaged by the load of the mounted device.

Figure 19:
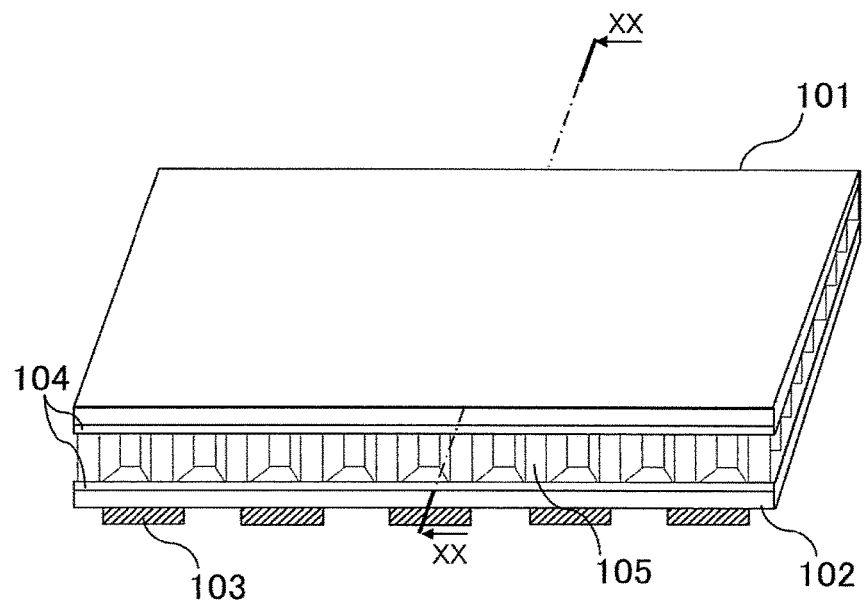
FIG. 19 is a perspective view showing a honeycomb sandwich structure to which the prior art has been applied.

Next, a problem newly investigated by the present inventor, which occurs in a honeycomb sandwich structure to which the prior art has been applied, will be described with reference to FIG. 19 and FIG. 20. FIG. 19 is a perspective view showing a honeycomb sandwich structure to which the prior art has been applied, and FIG. 20 is a sectional view seen in the direction of arrows XX-XX in FIG. 19.

Figure 20:
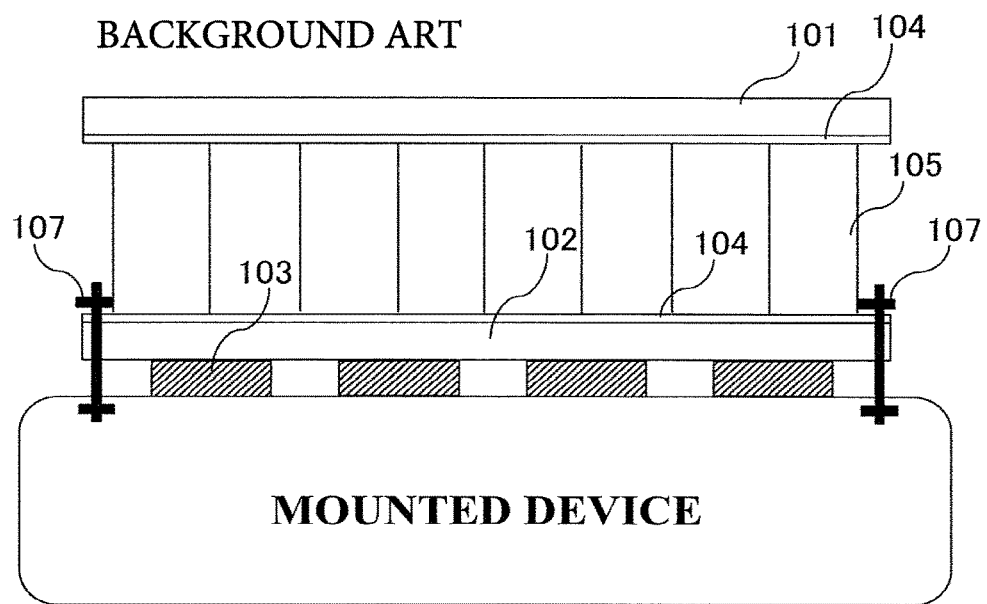
FIG. 20 is a sectional view seen in the direction of arrows XX-XX in FIG. 19.

In FIG. 19 and FIG. 20, the honeycomb sandwich structure to which the prior art has been applied includes first skin material 101, second skin material 102, a thermoelectric conversion module 103 being disposed on a front surface thereof, adhesive layers 104, and a honeycomb core 105. Further, as shown in FIG. 20, fastening tools 107 are used to mount a mounted device 106 on the second skin material 102 and fix a position of the mounted device 106 so that a high temperature side module front surface of the thermoelectric conversion module 103 contacts the mounted device 106.

With this configuration, heat generated during an operation of the mounted device 106 (in other words, heat generated by the mounted device 106) can be transmitted to the high temperature side module front surface. Accordingly, a temperature difference is generated between the high temperature side module front surface contacting the mounted device 106 and the low temperature side module rear surface contacting the second skin material 102, and therefore the thermoelectric conversion module 103 can generate power. Furthermore, in contrast to a case in which the thermoelectric conversion module 103 is disposed on the front surface of the first skin material 101, the low temperature side module rear surface does not contact cold air from outer space, and therefore the thermoelectric conversion efficiency of the thermoelectric conversion module 103 can be improved.

When the thermoelectric conversion module 103 is disposed on the front surface of the second skin material 102, however, the mounted device 106 contacts the high temperature side module front surface and does not contact the front surface of the second skin material 102, and therefore the load of the mounted device 106 is exerted entirely on the thermoelectric conversion module 103. As a result, the thermoelectric conversion module 103 is easily damaged, and may ultimately malfunction.

When this problem is taken into account, it is impossible with a honeycomb sandwich structure to which the prior art described in PTL 1 has been applied to improve the thermoelectric conversion efficiency of the thermoelectric conversion module while also preventing the thermoelectric conversion module from being damaged by the load of the mounted device.

Hence, the first embodiment provides a honeycomb sandwich structure with which the newly investigated problem described above can be solved, or in other words with which the second effect, i.e. improving the thermoelectric conversion efficiency of the thermoelectric conversion module while also preventing the load of the mounted device from damaging the thermoelectric conversion module when exerted thereon, can be realized in addition to the first effect.

Figure 2:
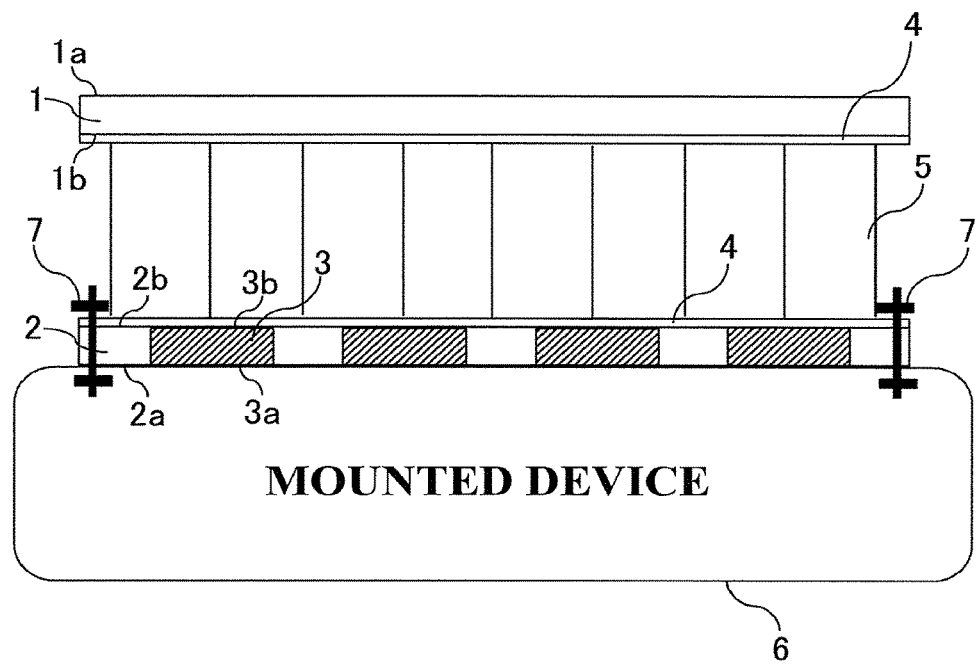
FIG. 2 is a sectional view seen in the direction of arrows II-II in FIG. 1.
Figure 3:
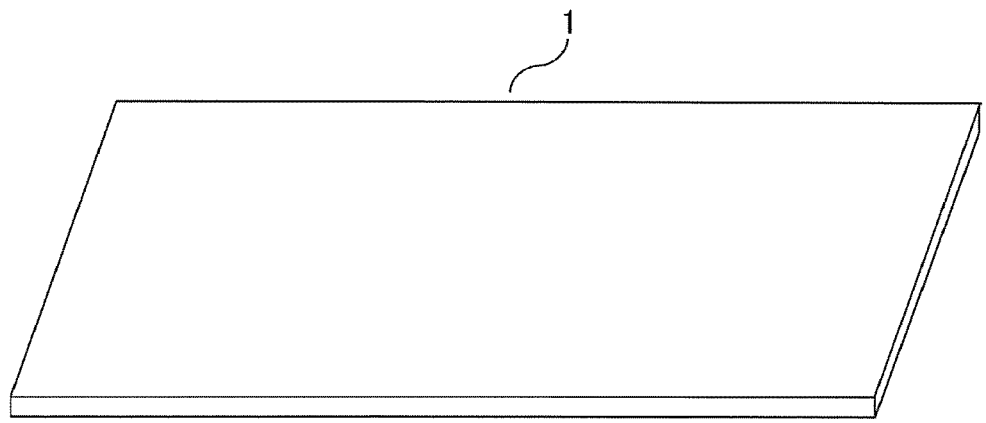
FIG. 3 is a perspective view showing first skin material of FIG. 1.
Figure 4:
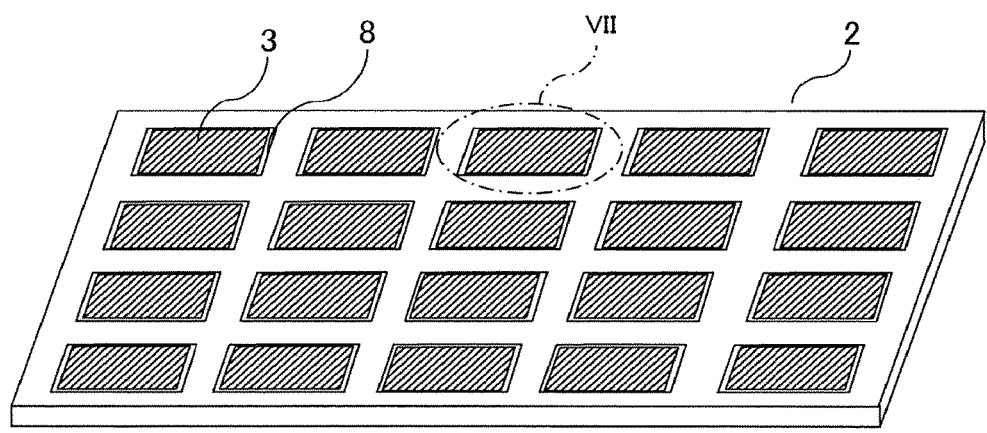
FIG. 4 is a perspective view showing second skin material of FIG. 1.
Figure 5:
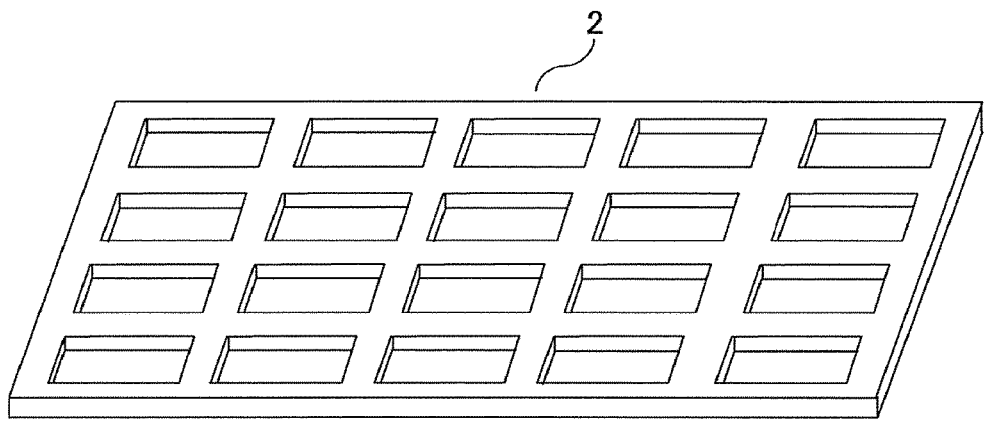
FIG. 5 is a perspective view showing the second skin material before a thermoelectric conversion module is disposed in a through hole in FIG. 4.
Figure 6:
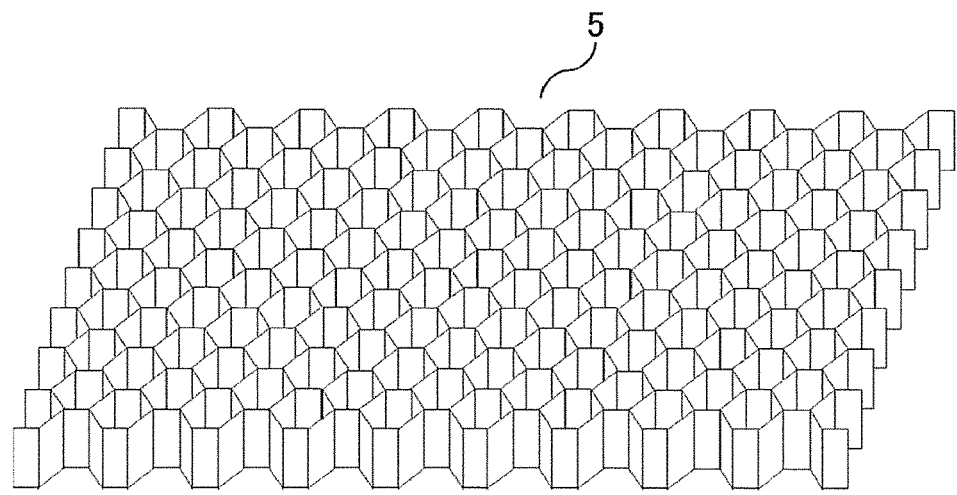
FIG. 6 is a perspective view showing a honeycomb core of FIG. 1.
Figure 7:
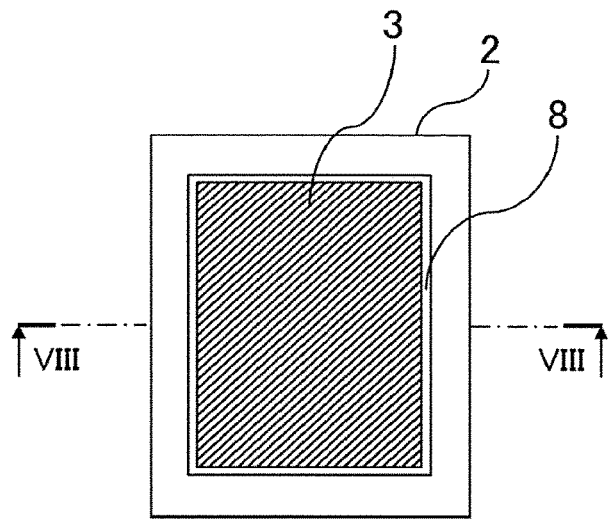
FIG. 7 is an enlarged plan view showing a VII portion of FIG. 4.
Figure 8:
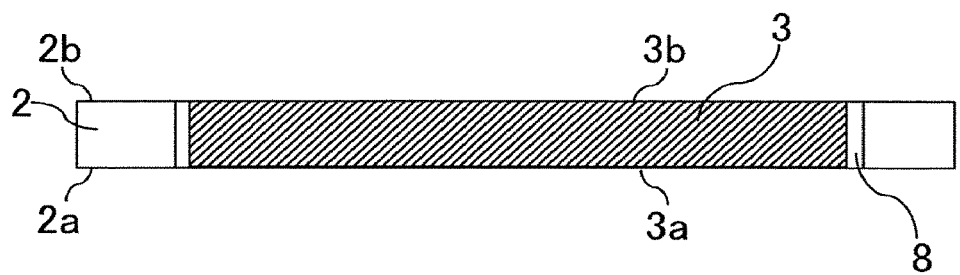
FIG. 8 is a sectional view seen in the direction of arrows VIII-VIII in FIG. 7.

Next, the honeycomb sandwich structure according to the first embodiment will be described with reference to FIG. 1 to FIG. 8. FIG. 1 is a perspective view showing the honeycomb sandwich structure according to the first embodiment of this invention. FIG. 2 is a sectional view seen in the direction of arrows II-II in FIG. 1. FIG. 3 is a perspective view showing first skin material 1 of FIG. 1. FIG. 4 is a perspective view showing second skin material 2 of FIG. 1. FIG. 5 is a perspective view showing the second skin material 2 before a thermoelectric conversion module 3 is disposed in a through hole in FIG. 4. FIG. 6 is a perspective view showing a honeycomb core 5 of FIG. 1. FIG. 7 is an enlarged plan view showing a VII portion of FIG. 4. FIG. 8 is a sectional view seen in the direction of arrows VIII-VIII in FIG. 7.

In FIG. 1 and FIG. 2, the honeycomb sandwich structure according to the first embodiment includes the thermoelectric conversion module 3, and a main body portion including the first skin material 1, the second skin material 2, adhesive layers 4, and the honeycomb core 5. The thermoelectric conversion module 3 is disposed inside the second skin material 2. Further, as shown in FIG. 2, fastening tools 7 are used to mount a mounted device 6 on the second skin material 2 and fix a position of the mounted device 6 so that a high temperature side module front surface 3a of the thermoelectric conversion module 3 contacts the mounted device 6. Note that bolts, for example, can be used as the fastening tools 7. Furthermore, a low temperature side module rear surface 3b of the thermoelectric conversion module 3 contacts the honeycomb core 5 via the adhesive layer 4.

As shown in FIG. 3, the first skin material 1 is formed in the shape of a sheet, and includes a first front surface 1a and a first rear surface 1b opposing the first front surface 1a.

The thermoelectric conversion module 3 includes the high temperature side module front surface 3a and the low temperature side module rear surface 3b opposing the module front surface 3a. Further, the thermoelectric conversion module 3 generates power using a temperature difference between the module front surface 3a, which contacts the mounted device 6, and the module rear surface 3b, which contacts the honeycomb core 5 via the adhesive layer 4.

As shown in FIG. 4, the second skin material 2 includes a second front surface 2a and a second rear surface 2b opposing the second front surface 2a, and the thermoelectric conversion module 3 is disposed in a through hole formed therein by implementing through hole formation. Furthermore, the through hole formation is implemented so that a plurality of the thermoelectric conversion modules 3 can be disposed respectively at intervals from each other. As a result, the thermoelectric conversion modules 3 can be prevented from contacting each other so as to peel away from the second skin material 2 or break when the second skin material 2 bends under a load exerted thereon by the mounted device 6.

Here, before the through hole formation is implemented, the second skin material 2 is identical to the first skin material 1 shown in FIG. 3. When the through hole formation is implemented, as shown in FIG. 5, a plurality of through holes in which to dispose the thermoelectric conversion modules 3 are formed in the second skin material 2.

Note that FIG. 3 shows an example in which the first skin material 1 and the second skin material 2 before implementing the through hole formation are respectively formed as sheets, but the invention is not limited to this example, and the shape of the first skin material 1 and the second skin material 2 before implementing the through hole formation may be modified as appropriate.

Further, FIG. 4 and FIG. 5 show an example in which 20 through holes, each having a larger size than the size of the thermoelectric conversion module 3, are formed in the second skin material 2, and one thermoelectric conversion module 3 is disposed in each formed through hole. However, the invention is not limited to this example, and the through holes formed in the second skin material 2 may be modified in number and size as appropriate. Furthermore, the thermoelectric conversion modules 3 may be modified in number and size as appropriate in accordance with the modified number and size of the through holes. Moreover, the second skin material 2 may be set at a thickness of at least 0.1 mm and at most 4 mm, for example.

Carbon fiber reinforced plastic, for example, may be employed as the material of the first skin material 1 and the second skin material 2. By employing carbon fiber reinforced plastic, the first skin material 1 and the second skin material 2 can be made extremely light, strong, and rigid. When the first skin material 1 and the second skin material 2 are formed from carbon fiber reinforced plastic, the first skin material 1 and the second skin material 2 may be molded using a semi-cured, sheet-form "pre-preg" manufactured by impregnating a plurality of bundled reinforced carbon fibers with resin, for example. This invention is not limited to carbon fiber reinforced plastic molded from a pre-preg, however, and carbon fiber reinforced plastic molded as desired may be employed as the material of the first skin material 1 and the second skin material 2. Moreover, this invention is not limited to carbon fiber reinforced plastic, and any fiber reinforced plastic formed from a combination of a plurality of reinforced fibers and resin may be employed as the material of the first skin material 1 and the second skin material 2.

The honeycomb core 5 is adhered to the first rear surface 1b of the first skin material and the second rear surface 2b of the second skin material, respectively, via the adhesive layers 4 so as to be sandwiched between the first skin material 1 and the second skin material 2.

Note that the honeycomb core 5 may be shaped as shown in FIG. 6, for example. Further, carbon fiber reinforced plastic using highly elastic pitch-based carbon fiber having high thermal conductivity (for example, K13C, manufactured by Mitsubishi Plastics, Inc.), aluminum, or foamed plastic, for example, may be employed as the material of the honeycomb core 5.

Next, the manner in which the thermoelectric conversion modules 3 are disposed in the through holes in the second skin material 2 will be described in further detail. As shown in FIG. 7 and FIG. 8, each thermoelectric conversion module 3 is disposed such that the module front surface 3a is flush with the second front surface 2a of the second skin material 2 and the module rear surface 3b is flush with the second rear surface 2b of the second skin material 2. In other words, the thermoelectric conversion module 3 is disposed such that the module front surface 3a and the second front surface 2a of the second skin material 2 are positioned on an identical plane, and the module rear surface 3b and the second rear surface 2b of the second skin material 2 are positioned on an identical plane. In this case, the thickness of the thermoelectric conversion module 3 is set to be equal to the thickness of the second skin material 2.

Further, as shown in FIG. 7, the size of the thermoelectric conversion module 3 is set to be smaller than the size of the through hole in the second skin material 2. In this case, the thermoelectric conversion module 3 is adhered to the through hole in the second skin material 2 via an adhesive layer 8.

As is evident from the above description, in the first embodiment, the thermoelectric conversion module 3 is embedded in the main body portion such that the module front surface 3a is in a state of being exposed from the main body portion, with the result that a temperature difference is generated between the module front surface 3a and the module rear surface 3b. More specifically, the thermoelectric conversion module 3 is embedded in the main body portion such that the module front surface 3a is in a state of being exposed from the main body portion and is flush with the second front surface 2a of the second skin material 2, whereas the module rear surface 3b is not in a state of being exposed from the main body portion. Note that in the first embodiment, the module rear surface 3b is set to be flush with the second rear surface 2b of the second skin material 2 without being exposed from the main body portion.

As shown in FIG. 1 and FIG. 2, when the second skin material 2 configured such that the thermoelectric conversion modules 3 are disposed in the through holes therein is employed, the module front surface 3a of the thermoelectric conversion module 3 contacts the mounted device 6 and the module rear surface 3b contacts the honeycomb core 5 via the adhesive layer 4. Further, the heat generated by the mounted device 6 can be transmitted to the high temperature side module front surface 3a. Hence, when the mounted device 6 is operated, a temperature difference is generated between the high temperature side module front surface 3a and the low temperature side module rear surface 3b due to the heat generated by the mounted device 6, and as a result, the thermoelectric conversion module 3 can generate power.

Moreover, the low temperature side module rear surface 3b does not contact cold air from outer space, and therefore the thermoelectric conversion efficiency of the thermoelectric conversion module 3 can be improved. Furthermore, the mounted device 6 is supported by the second skin material 2 as well as the thermoelectric conversion module 3, and therefore the load of the mounted device 6 can be dispersed, thereby lightening the load exerted on the thermoelectric conversion module 3.

Note that when carbon fiber reinforced plastic using pitch-based carbon fiber is employed as the material of the honeycomb core 5, high thermal conductivity is obtained, and therefore cold air from outer space is more likely to be transmitted to the honeycomb core 5. Accordingly, the cold air is also more likely to be transmitted to the module rear surface 3b, and therefore the temperature of the module rear surface 3b is more likely to decrease. As a result, the temperature difference between the module front surface 3a and the module rear surface 3b increases, enabling a further improvement in the thermoelectric conversion efficiency of the thermoelectric conversion module, and this improvement contributes to an increase in the amount of generated power.

Figure 9:
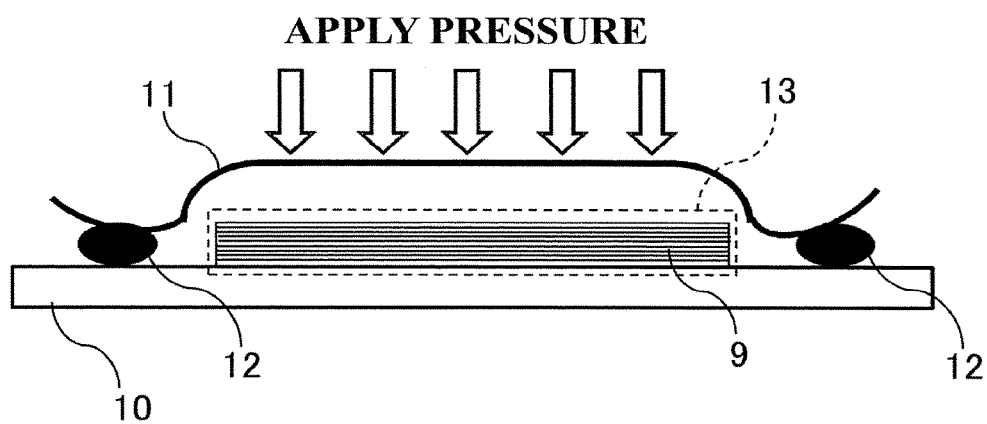
FIG. 9 is an illustrative view illustrating a manufacturing process for manufacturing the first skin material and the second skin material prior to through hole formation, according to the first embodiment of this invention.
Figure 10:
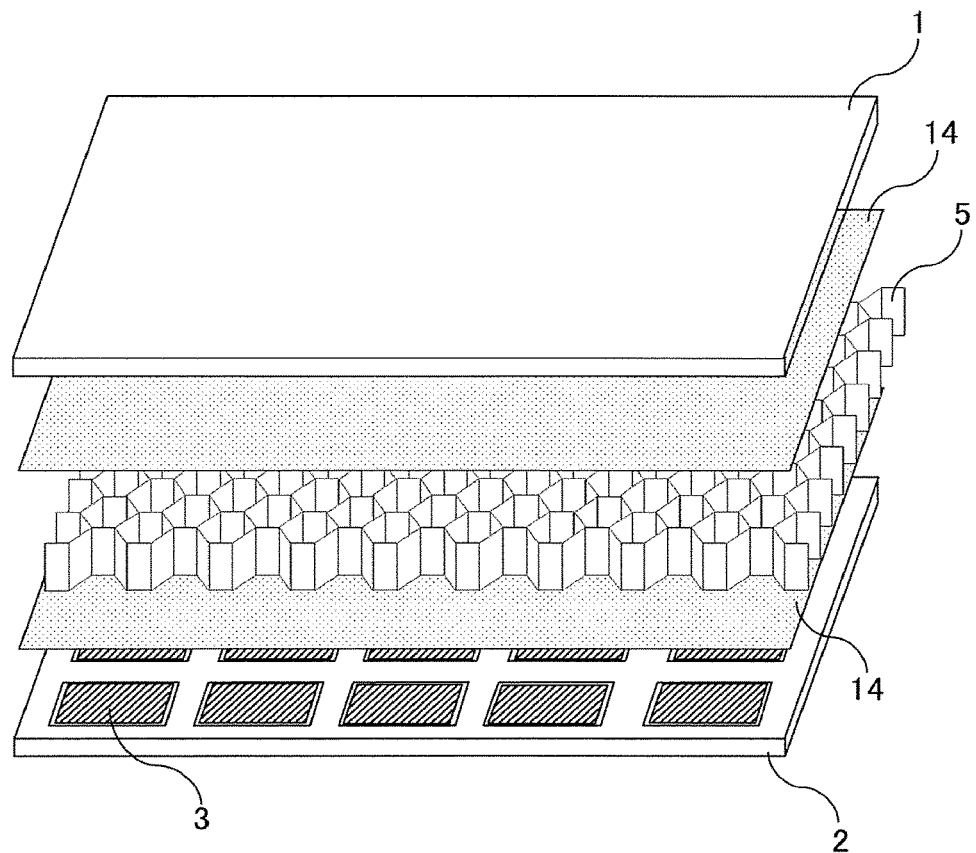
FIG. 10 is a first illustrative view illustrating a honeycomb sandwich structure manufacturing process according to the first embodiment of this invention.
Figure 11:
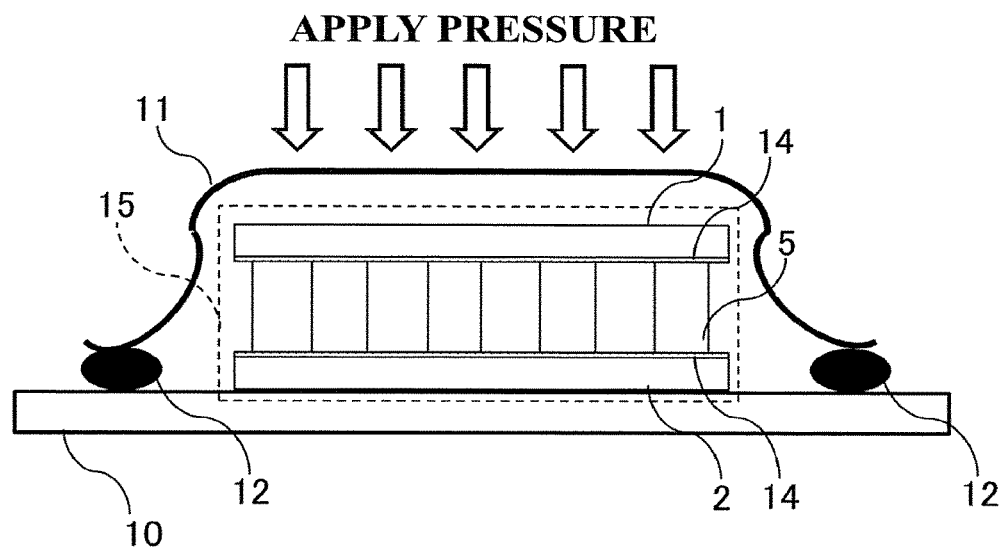
FIG. 11 is a second illustrative view illustrating the honeycomb sandwich structure manufacturing process according to the first embodiment of this invention.

Next, a method of manufacturing a honeycomb sandwich structure according to the first embodiment will be described with reference to FIG. 9 to FIG. 11. FIG. 9 is an illustrative view illustrating a manufacturing process for manufacturing the first skin material 1 and the second skin material 2 prior to through hole formation, according to the first embodiment of this invention. FIG. 10 is a first illustrative view illustrating a honeycomb sandwich structure manufacturing process according to the first embodiment of this invention. FIG. 11 is a second illustrative view illustrating the honeycomb sandwich structure manufacturing process according to the first embodiment of this invention.

First, in a skin material manufacturing step, the first skin material 1 and the second skin material 2 prior to through hole formation are manufactured. More specifically, as shown in FIG. 9, a plurality of laminated pre-pregs 9 are disposed on a surface plate 10, covered entirely by a bagging film 11, and sealed by a sealing material 12. After sealing the pre-pregs 9 with the sealing material 12, a molding material 13 in a vacuum condition is pressurized to atmospheric pressure (approximately 1 atm) by operating a pump (not shown).

Next, the first skin material 1 and the second skin material 2 prior to through hole formation can be manufactured by heating the molding material 13 under pressure using an autoclave method. Here, the autoclave method is a method of curing and molding a molding material disposed in an autoclave that can be controlled to a desired temperature and a desired pressure by heating the molding material under pressure (for example, maintaining the molding material at a temperature of 120° C. for three hours at 3 atm). Note that the conditions in which the molding material 13 is heated under pressure differ according to the type of resin used to form the molding material 13. Further, the method of manufacturing the first skin material 1 and the second skin material 2 prior to through hole formation is not limited to the autoclave method described above, and another method may be used.

Next, in a through hole forming step, the through holes in which to dispose the thermoelectric conversion modules 3 are formed in the second skin material 2 prior to through hole formation. More specifically, the second skin material 2 in which the through holes are formed, as shown in FIG. 5, is obtained by machining.

Next, in a thermoelectric conversion module disposing step, the thermoelectric conversion modules 3 are disposed in the through holes formed in the second skin material 2. More specifically, the thermoelectric conversion modules 3 are disposed in the through holes such that each module front surface 3a is flush with the second front surface 2a of the second skin material 2 and each module rear surface 3b is flush with the second rear surface 2b of the second skin material 2. Moreover, the thermoelectric conversion modules 3 disposed in the through holes are adhered to the respective through holes via the adhesive layers 8, and therefore the positions thereof are fixed. Note that a silicon-based adhesive, for example, may be employed as the adhesive layer 8. Further, the thermoelectric conversion modules 3 disposed in the through holes may be adhered and fixed to the through holes using a different adhesion method such as metallic bonding (soldering, for example).

By executing the skin material manufacturing step, the through hole forming step, and the thermoelectric conversion module disposing step in the manner described above, the first skin material 1 shown in FIG. 3 and the second skin material 2 shown in FIG. 4 can be manufactured.

Next, in a honeycomb sandwich structure manufacturing step, the honeycomb core 5 is adhered to the first rear surface 1b of the first skin material 1 and the second rear surface 2b of the second skin material 2, respectively, so that the honeycomb core 5 is in a state of being sandwiched between the first skin material 1 and the second skin material 2.

More specifically, as shown in FIG. 10, an adhesive film 14 is adhered to the second skin material 2, whereupon the honeycomb core 5 is disposed on the adhesive film 14. Next, the first skin material 1, to which the adhesive film 14 is adhered, is placed on the disposed honeycomb core 5, thereby forming a molding material 15. Note that an epoxy adhesive that has a thickness of 60 μm and is cured at 180° C., for example, may be used as the adhesive film 14. Further, the adhesive film 14 is not limited to an epoxy resin that is cured at 180° C., and any thermosetting resin may be used. Moreover, the molding material 15 may be formed using a liquid adhesive instead of the adhesive film 14.

Next, as shown in FIG. 11, the molding material 15 is disposed on the surface plate 10, covered entirely by the bagging film 11, and sealed by the sealing material 12. After sealing the molding material 15 with the sealing material 12, the molding material 15 is set in a vacuum condition by operating the pump (not shown). Next, the molding material 15 is heated under pressure (for example, held at a temperature of 120° C. for six hours at atmospheric pressure (approximately 1 atm)), whereby the honeycomb core 5 can be adhered to the first rear surface 1b of the first skin material 1 and the second rear surface 2b of the second skin material 2, respectively, via the adhesive layers 4. Note that the conditions in which the molding material 15 is heated under pressure differ according to the type of the adhesive film 14.

By executing the honeycomb sandwich structure manufacturing step described above, the honeycomb sandwich structure shown in FIG. 1 can be manufactured.

In the honeycomb sandwich structure according to the first embodiment, the thermoelectric conversion module is embedded in the main body portion such that the module front surface is in a state of being exposed from the main body portion, with the result that a temperature difference is generated between the module front surface and the module rear surface.

Hence, the thermoelectric conversion module is embedded in the main body portion rather than being adhered directly to the skin material, as in the prior art, and as a result, the thermoelectric conversion module can be prevented from peeling away from the skin material in response to an external impact.

Further, in the configuration described above, the thermoelectric conversion module is embedded in the main body portion such that the module front surface is in a state of being exposed from the main body portion and is flush with the second front surface of the second skin material, whereas the module rear surface is not in a state of being exposed from the main body portion.

Therefore, when the mounted device is mounted on the second skin material, the heat generated by the mounted device during an operation of the mounted device causes a temperature difference to occur between the high temperature side module front surface and the low temperature side module rear surface, and as a result, the thermoelectric conversion module can generate power. Moreover, the low temperature side module rear surface does not come into contact with cold air from outer space, and therefore the thermoelectric conversion efficiency of the thermoelectric conversion module can be improved.

Furthermore, the mounted device is supported by the second skin material as well as the thermoelectric conversion module, and therefore the load of the mounted device can be dispersed, thereby lightening the load exerted on the thermoelectric conversion module. As a result, the likelihood of the thermoelectric conversion module malfunctioning can be reduced. When the honeycomb sandwich structure according to the first embodiment is applied to a spacecraft in particular, the likelihood of the thermoelectric conversion module, which is unable to withstand device loads, malfunctioning due to damage caused by a load generated by the weight of the mounted device and a load generated by vibration of the mounted device during a satellite launch can be reduced.

Hence, damage to the thermoelectric conversion module caused by the load of the mounted device can be suppressed while also improving the thermoelectric conversion efficiency. When the honeycomb sandwich structure according to the first embodiment is applied to a spacecraft in particular, the performance of the thermoelectric conversion module can be maximized so that the thermoelectric conversion module generates power with a high degree of efficiency, and by lightening the load exerted on the thermoelectric conversion module, a strong and rigid spacecraft can be realized.

Second Embodiment

Figure 12:
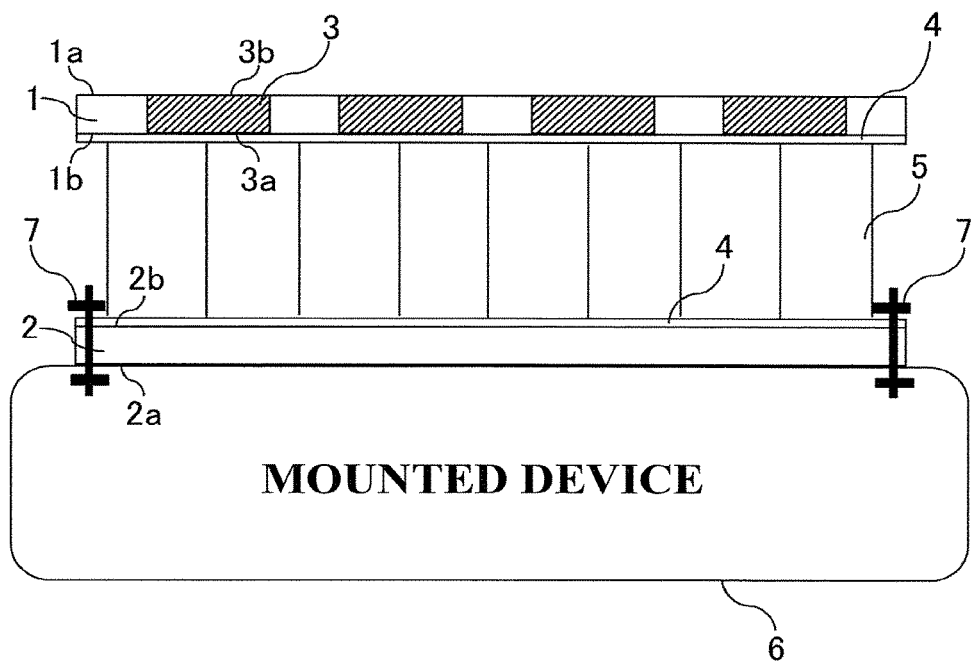
FIG. 12 is a sectional view showing a honeycomb sandwich structure according to a second embodiment of this invention.

A second embodiment of this invention differs from the first embodiment in that the module rear surface $3b$ of the thermoelectric conversion module 3 is in a state of being exposed from the main body portion and the module front surface $3a$ is not in a state of being exposed from the main body portion. FIG. 12 is a sectional view showing a honeycomb sandwich structure according to the second embodiment of this invention. Note that FIG. 12 is a sectional view showing a configuration that differs from the configuration shown in FIG. 2 in that the module rear surface $3b$ is in a state of being exposed from the main body portion and the module front surface $3a$ is not in a state of being exposed from the main body portion. Further, the description of the second embodiment will focus on points that differ from the first embodiment, while points that are similar to the first embodiment will not be described.

In the second embodiment, the thermoelectric conversion module 3 is embedded in the main body portion such that the module rear surface $3b$ is in a state of being exposed from the main body portion and the module front surface $3a$ is not in a state of being exposed from the main body portion.

More specifically, as shown in FIG. 12, the thermoelectric conversion module 3 is embedded in the main body portion such that the module rear surface $3b$ is in a state of being exposed from the main body portion and is flush with the first front surface $1a$, and the module front surface $3a$ is flush with the first rear surface $1b$ without being exposed from the main body portion.

With this configuration, the low temperature side module rear surface $3b$ can contact cold air from outer space, while the high temperature side module front surface $3a$ can be prevented from contacting cold air from outer space. Accordingly, a temperature difference can be generated between the module front surface $3a$ and the module rear surface $3b$, and as a result, the thermoelectric conversion module 3 can generate power. Note that when the configuration described above is employed, a thermoelectric conversion module of a type that can be operated at the temperature of cold air from outer space is preferably used as the thermoelectric conversion module 3.

Note that although FIG. 12 shows a case in which the module rear surface $3b$ is in a state of being exposed from the main body portion and is flush with the first front surface $1a$, the invention is not limited to this example. More specifically, as long as the module rear surface $3b$ is in a state of being exposed from the main body portion, the module rear surface $3b$ need not be flush with the first front surface $1a$. Furthermore, although FIG. 12 shows a case in which the module front surface $3a$ is flush with the first rear surface $1b$ without being exposed from the main body portion, the invention is not limited to this example. More specifically, as long as the module front surface $3a$ is not in a state of being exposed from the main body portion, the module front surface $3a$ need not be flush with the first rear surface $1b$.

In the honeycomb sandwich structure according to the second embodiment, the thermoelectric conversion module is embedded in the main body portion such that the module rear surface is in a state of being exposed from the main body portion and the module front surface is not in a state of being exposed from the main body portion.

Similarly to the first embodiment, therefore, the thermoelectric conversion module can be prevented from peeling away from the skin material in response to an external impact. Moreover, when the mounted device is mounted on the second skin material, the thermoelectric conversion module does not contact the mounted device, and therefore, similarly to the first embodiment, damage to the thermoelectric conversion module caused by the load of the mounted device can be suppressed.

Third Embodiment

Figure 13:
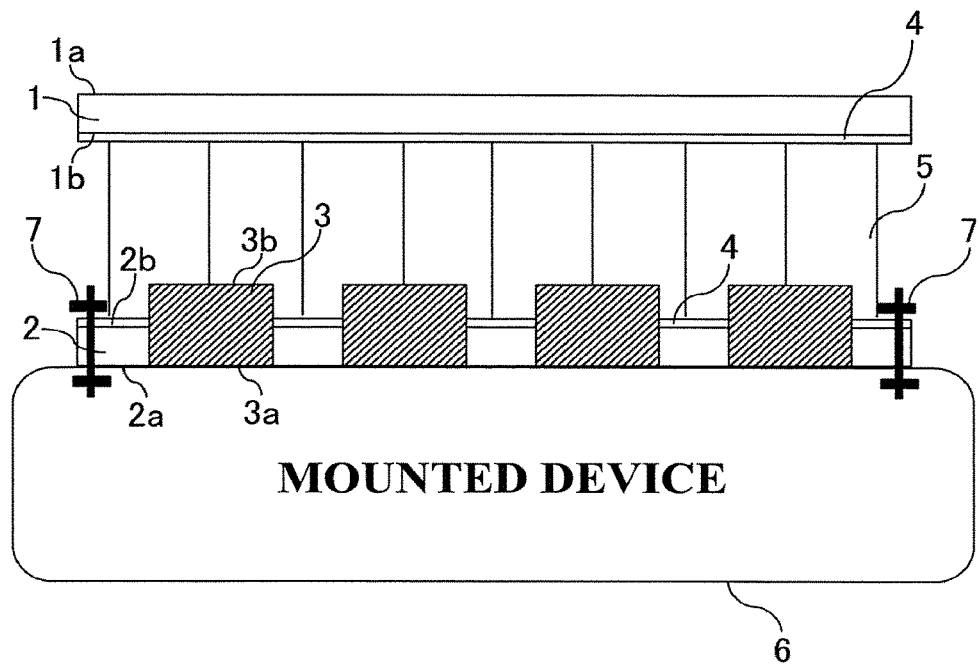
FIG. 13 is a sectional view showing a honeycomb sandwich structure according to a third embodiment of this invention.

A third embodiment of this invention differs from the first embodiment in that the module rear surface $3b$ of the thermoelectric conversion module 3 is not flush with the second rear surface $2b$ of the second skin material 2. FIG. 13 is a sectional view showing a honeycomb sandwich structure according to the third embodiment of this invention. Note that FIG. 13 is a sectional view showing a configuration that differs from the configuration shown in FIG. 2 in that the module rear surface $3b$ is not flush with the second rear surface $2b$. Further, the description of the third embodiment will focus on points that differ from the first embodiment, and points that are similar to the first embodiment will not be described.

In FIG. 13, the thermoelectric conversion module 3 is embedded in the main body portion such that the module front surface $3a$ is flush with the second front surface $2a$, similarly to the first embodiment. Further, in the thermoelectric conversion module 3 embedded in the main body portion, the module rear surface $3b$ is not in a state of being exposed from the main body portion. In contrast to the first embodiment, however, the module rear surface $3b$ is positioned within the honeycomb core 5 instead of being flush with the second rear surface $2b$. In other words, a part of the thermoelectric conversion module 3 disposed on the second skin material 2 projects to the honeycomb core 5 side.

With this configuration, a thicker thermoelectric conversion module 3 than the thermoelectric conversion module of the first embodiment can be mounted, and therefore a higher power regeneration output can be expected. Further, when this configuration is employed, a groove for accommodating the part of the thermoelectric conversion module 3 that projects to the honeycomb core 5 side is preferably formed in advance in the honeycomb core 5 by machining.

The honeycomb sandwich structure according to the third embodiment differs from that of the first embodiment in that the module rear surface of the thermoelectric conversion module embedded in the main body portion is positioned within the honeycomb core instead of being flush with the second rear surface of the second skin material. As a result, similar effects to the first embodiment are obtained.

Fourth Embodiment

Figure 14:
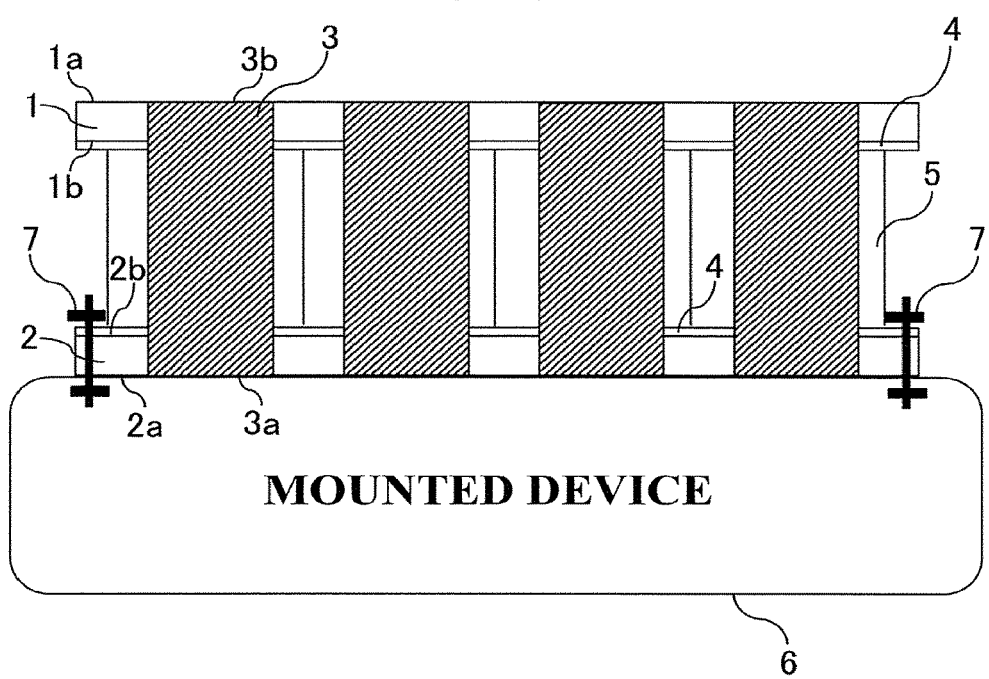
FIG. 14 is a sectional view showing a honeycomb sandwich structure according to a fourth embodiment of this invention.

A fourth embodiment of this invention differs from the first embodiment in that the module rear surface $3b$ of the thermoelectric conversion module 3 is in a state of being exposed from the main body portion. FIG. 14 is a sectional view showing a honeycomb sandwich structure according to the fourth embodiment of this invention. Note that FIG. 14 is a sectional view showing a configuration that differs from the configuration shown in FIG. 2 in that the module rear surface $3b$ is in a state of being exposed from the main body portion. Further, the description of the fourth embodiment will focus on points that differ from the first embodiment, and points that are similar to the first embodiment will not be described.

In the fourth embodiment, the thermoelectric conversion module 3 is embedded in the main body portion such that the module front surface 3a is in a state of being exposed from the main body portion and is flush with the second front surface 2a, and the module rear surface 3b is in a state of being exposed from the main body portion.

More specifically, as shown in FIG. 14, the thermoelectric conversion module 3 is embedded in the main body portion such that the module front surface 3a is in a state of being exposed from the main body portion and is flush with the second front surface 2a, and the module rear surface 3b is in a state of being exposed from the main body portion and is flush with the first front surface 1a.

With this configuration, the low temperature side module rear surface 3b can contact cold air from outer space and the high temperature side module front surface 3a can contact the mounted device 6. Accordingly, the temperature difference between the module front surface 3a and the module rear surface 3b can be increased in comparison with the first embodiment. Moreover, a thicker thermoelectric conversion module 3 than the thermoelectric conversion module of the first embodiment can be mounted, and therefore a higher power regeneration output can be expected.

Note that when the configuration described above is employed, the thickness of the main body portion is preferably adjusted in accordance with the thickness of the thermoelectric conversion module 3. More specifically, when the employed thermoelectric conversion module 3 has a thickness of approximately 10 mm, for example, the thickness of the main body portion is likewise preferably set at approximately 10 mm.

Note that although FIG. 14 shows a case in which the module rear surface 3b is in a state of being exposed from the main body portion and is flush with the first front surface 1a, the invention is not limited to this example. More specifically, as long as the module rear surface 3b is in a state of being exposed from the main body portion, the module rear surface 3b need not be flush with the first front surface 1a.

In the honeycomb sandwich structure according to the fourth embodiment, the thermoelectric conversion module is embedded in the main body portion such that the module front surface is in a state of being exposed from the main body portion and is flush with the second front surface of the second skin material, and the module rear surface is in a state of being exposed from the main body portion.

Similarly to the first embodiment, therefore, the thermoelectric conversion module can be prevented from peeling away from the skin material in response to an external impact. Moreover, similarly to the first embodiment, when the mounted device is mounted on the second skin material, damage to the thermoelectric conversion module caused by the load of the mounted device can be suppressed.

Fifth Embodiment

Figure 15A:
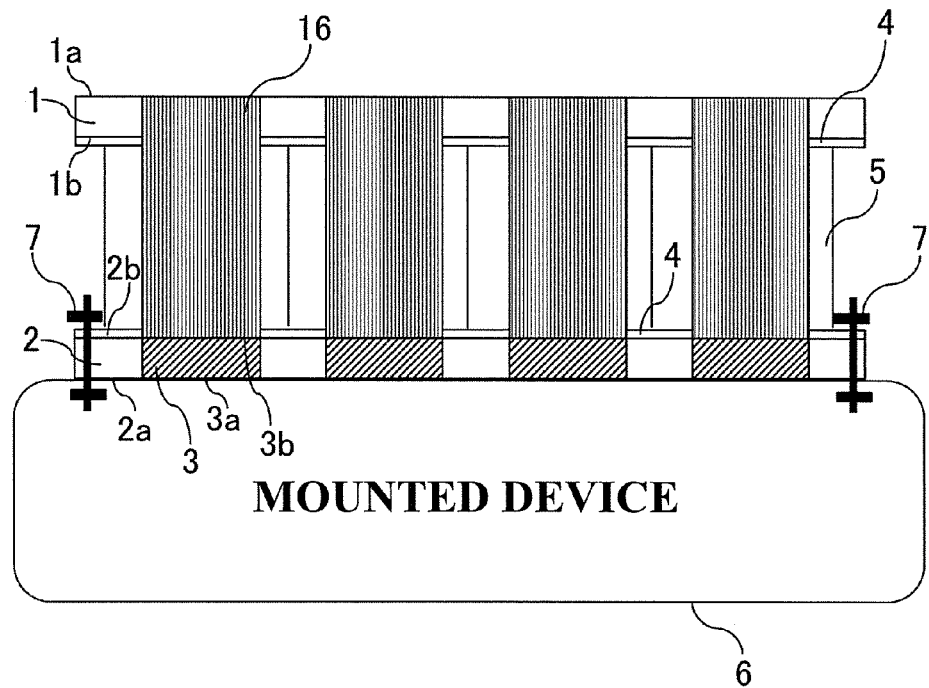
FIGS. 15A and 15B are sectional views showing a honeycomb sandwich structure according to a fifth embodiment of this invention.
Figure 15B:
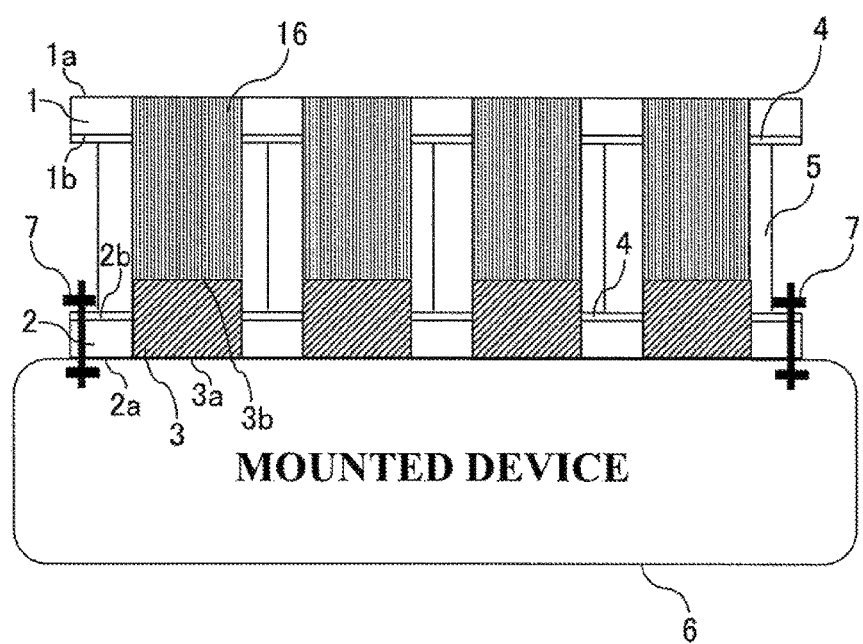

A fifth embodiment of this invention differs from the first embodiment in further including a thermally conductive material 16. FIGS. 15A and 15B are sectional views showing a honeycomb sandwich structure according to the fifth embodiment of this invention. Note that FIG. 15A is a sectional view showing a configuration that differs from the configuration shown in FIG. 2 in that the thermally conductive material 16 is further provided. Moreover, the description of the fifth embodiment will focus on points that differ from the first embodiment, and points that are similar to the first embodiment will not be described.

In the fifth embodiment, the thermally conductive material 16 is embedded in the main body portion such that one surface of the thermally conductive material 16 contacts the module rear surface 3b of the thermoelectric conversion module 3, the thermoelectric conversion module 3 being embedded in the main body portion in a similar manner to the first embodiment, and another surface of the thermally conductive material 16 that opposes the surface contacting the module rear surface 3b is in a state of being exposed from the main body portion.

More specifically, as shown in FIG. 15A, the thermally conductive material 16 is embedded in the main body portion such that one surface of the thermally conductive material 16 contacts the module rear surface 3b and the other surface of the thermally conductive material 16 that opposes the surface contacting the module rear surface 3b is in a state of being exposed from the main body portion and is flush with the first front surface 1a.

Note that graphite block (for example, graphite block having a thermal conductivity of 1500 W/mK in an XY direction, manufactured by Kaneka Corporation) may be cited as an example of the thermally conductive material 16.

With this configuration, cold air from outer space is more likely to be transmitted to the module rear surface 3b, and therefore the temperature of the module rear surface 3b is more likely to decrease. In comparison with the first embodiment, therefore, the temperature difference between the module front surface 3a and the module rear surface 3b can be increased, and as a result, a higher power regeneration output can be expected.

Note that although FIG. 15A shows a case in which the surface of the thermally conductive material 16 that opposes the surface contacting the module rear surface 3b is in a state of being exposed from the main body portion and is flush with the first front surface 1a, the invention is not limited to this example. More specifically, as long as the surface of the thermally conductive material 16 that opposes the surface contacting the module rear surface 3b is in a state of being exposed from the main body portion, the surface that opposes the surface contacting the module rear surface 3b need not be flush with the first front surface 1a.

The thermally conductive material 16 may also be provided in the second embodiment. In this case, the thermally conductive material 16 is embedded in the main body portion such that one surface of the thermally conductive material 16 contacts the module front surface 3a and the other surface of the thermally conductive material 16 that opposes the surface contacting the module rear surface 3b is in a state of being exposed from the main body portion and is flush with the second front surface 2a.

With this configuration, the heat generated by the mounted device 6 is more likely to be transmitted to the module front surface 3a via the thermally conductive material 16, and therefore the temperature of the module front surface 3a is more likely to increase. Accordingly, the temperature difference between the module front surface 3a and the module rear surface 3b can be increased in comparison with the second embodiment, and as a result, a higher power regeneration output can be expected.

The thermally conductive material 16 may also be provided in combination with the third embodiment, shown in FIG. 15B. In this case, the thermally conductive material 16 is embedded in the main body portion such that one surface of the thermally conductive material 16 contacts the module rear surface 3b and the other surface of the thermally conductive material 16 that opposes the surface contacting the module rear surface 3b is in a state of being exposed from the main body portion. With this configuration, cold air from outer space is more likely to be transmitted to the module rear surface 3b via the thermally conductive material 16, and therefore the temperature of the module rear surface 3b is more likely to decrease.

In the honeycomb sandwich structure according to the fifth embodiment, the thermally conductive material is added to the respective configurations of the first to third embodiments. As a result, similar effects to the first to third embodiments can be obtained, and moreover, a higher power regeneration output can be expected.

Sixth Embodiment

Figure 16:
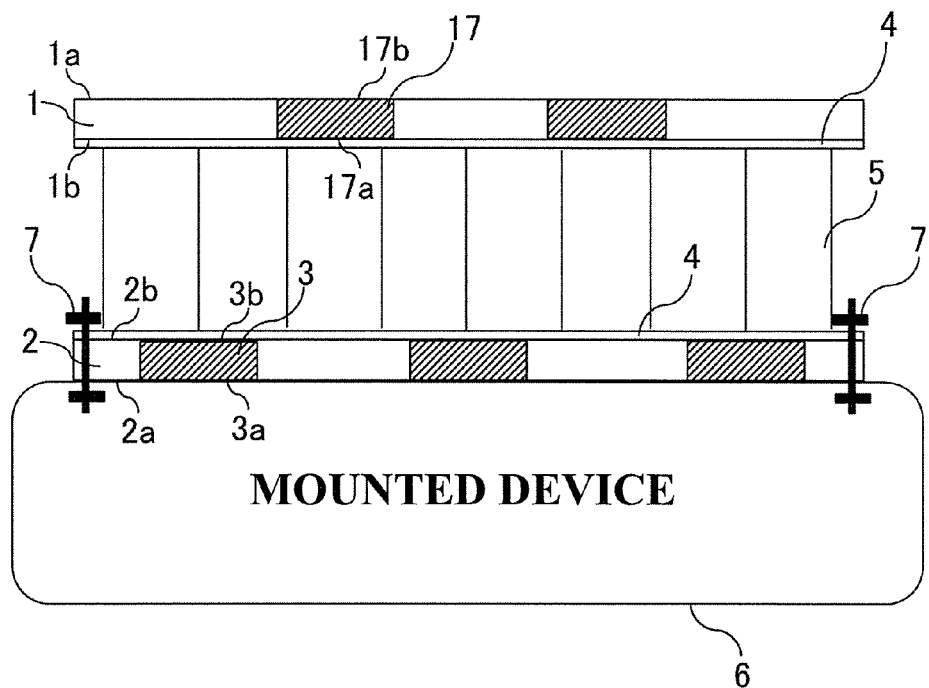
FIG. 16 is a sectional view showing a honeycomb sandwich structure according to a sixth embodiment of this invention.

A sixth embodiment of this invention differs from the first embodiment in further including an auxiliary thermoelectric conversion module 17. FIG. 16 is a sectional view showing a honeycomb sandwich structure according to the sixth embodiment of this invention. Note that FIG. 16 is a sectional view showing a configuration that differs from the configuration shown in FIG. 2 in that the auxiliary thermoelectric conversion module 17 is further provided. Moreover, the description of the sixth embodiment will focus on points that differ from the first embodiment, and points that are similar to the first embodiment will not be described.

The auxiliary thermoelectric conversion module 17 is configured similarly to the thermoelectric conversion module 3. More specifically, the auxiliary thermoelectric conversion module 17 includes a high temperature side module front surface (referred to hereafter as an auxiliary module front surface 17a) and a low temperature side module rear surface (referred to hereafter as an auxiliary module rear surface 17b) that opposes the auxiliary module front surface 17a. Further, the auxiliary thermoelectric conversion module 17 generates power using a temperature difference between the auxiliary module front surface 17a and the auxiliary module rear surface 17b.

In the sixth embodiment, the auxiliary thermoelectric conversion module 17 is embedded in the main body portion such that the auxiliary module rear surface 17b is in a state of being exposed from the main body portion and the auxiliary module front surface 17a is not in a state of being exposed from the main body portion. Further, the auxiliary module rear surface 17b is in a state of being exposed from the opposite side to the mounted device 6 side rather than being exposed from the mounted device 6 side.

More specifically, as shown in FIG. 16, the auxiliary thermoelectric conversion module 17 is embedded in the main body portion such that the auxiliary module rear surface 17b is in a state of being exposed from the main body portion and is flush with the first front surface 1a, whereas the auxiliary module front surface 17a is flush with the first rear surface 1b without being exposed from the main body portion.

As shown in FIG. 16, to ensure that the thermoelectric conversion module 3 and the auxiliary thermoelectric conversion module 17 do not act as thermal insulators, the auxiliary thermoelectric conversion module 17 disposed on the first skin material 1 side and the thermoelectric conversion module 3 disposed on the second skin material 2 side are preferably positioned so as not to oppose each other.

With this configuration, the low temperature side auxiliary module rear surface 17b can contact cold air from outer space and the high temperature side auxiliary module front surface 17a can be prevented from contacting cold air from outer space. Accordingly, a temperature difference can be generated between the auxiliary module front surface 17a and the auxiliary module rear surface 17b, and as a result, the auxiliary thermoelectric conversion module 17 can generate power.

By providing the auxiliary thermoelectric conversion module 17 in the first embodiment in this manner, power can be generated by the auxiliary thermoelectric conversion module 17 in addition to the power generated by the thermoelectric conversion module 3, and as a result, an even higher power regeneration output can be expected.

Note that although FIG. 16 shows a case in which the auxiliary module rear surface 17b is in a state of being exposed from the main body portion and is flush with the first front surface 1a, the invention is not limited to this example. More specifically, as long as the auxiliary module rear surface 17b is in a state of being exposed from the main body portion, the auxiliary module rear surface 17b need not be flush with the first front surface 1a. Furthermore, although FIG. 16 shows a case in which the auxiliary module front surface 17a is flush with the first rear surface 1b without being exposed from the main body portion, the invention is not limited to this example. More specifically, as long as the auxiliary module front surface 17a is not in a state of being exposed from the main body portion, the auxiliary module front surface 17a need not be flush with the first rear surface 1b.

The auxiliary thermoelectric conversion module 17 may also be added to the respective configurations of the third to fifth embodiments, and in so doing, similar effects are obtained.

In the honeycomb sandwich structure according to the sixth embodiment, the auxiliary thermoelectric conversion module, which is embedded in the main body portion such that the auxiliary module rear surface is in a state of being exposed from the main body portion and the auxiliary module front surface is not in a state of being exposed from the main body portion, is added to the respective configurations of the first embodiment and the third to fifth embodiments. Therefore, power can be generated by the auxiliary thermoelectric conversion module in addition to the power generated by the thermoelectric conversion module, and as a result, a higher power regeneration output can be expected.

Seventh Embodiment

Figure 17:
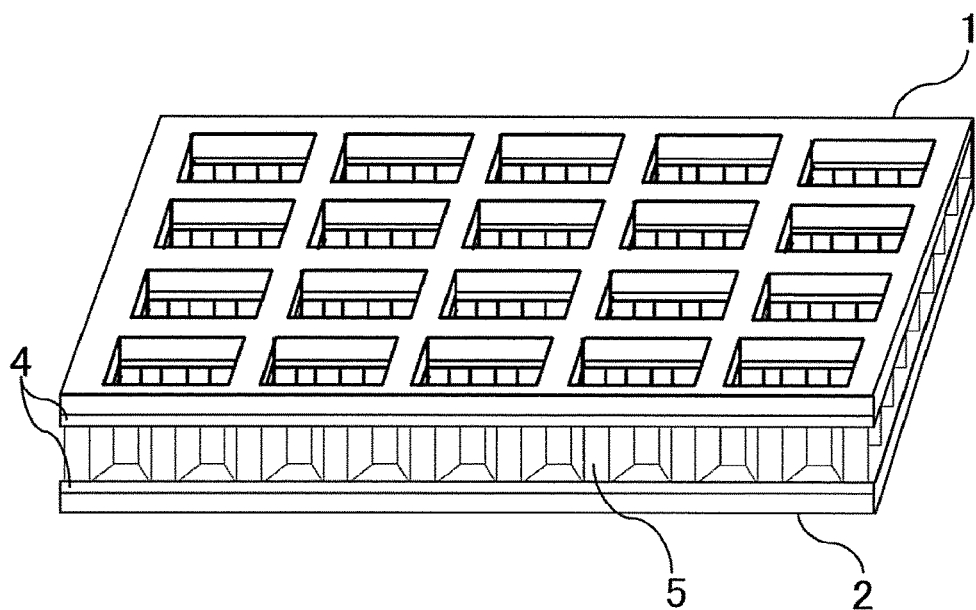
FIG. 17 is a first illustrative view illustrating a honeycomb sandwich structure manufacturing process according to a seventh embodiment of this invention.
Figure 18:
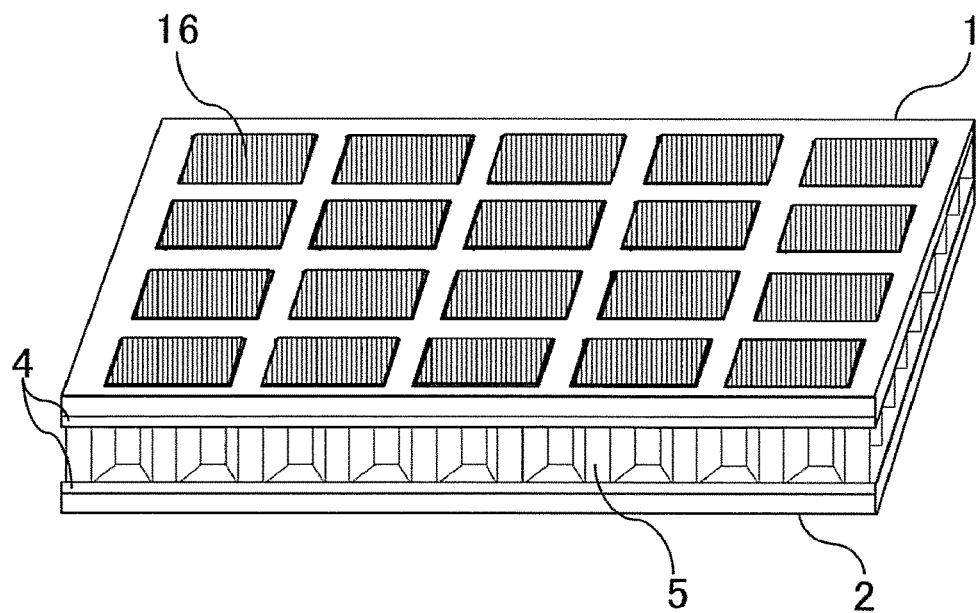
FIG. 18 is a second illustrative view illustrating the honeycomb sandwich structure manufacturing process according to the seventh embodiment of this invention.

In a seventh embodiment of this invention, examples of manufacturing methods for manufacturing the honeycomb sandwich structures according to the first to sixth embodiments will be described. FIG. 17 is a first illustrative view illustrating a honeycomb sandwich structure manufacturing process according to the seventh embodiment of this invention, and FIG. 18 is a second illustrative view illustrating the honeycomb sandwich structure manufacturing process according to the seventh embodiment of this invention. Note that the description of the seventh embodiment will focus on points that differ from the first to sixth embodiments, and points that are similar to the first to sixth embodiments will not be described.

Here, the method of manufacturing a honeycomb sandwich structure includes an embedding hole forming step and a thermoelectric conversion module disposing step. In the embedding hole forming step, embedding holes for embedding the thermoelectric conversion modules 3 in the main body portion such that at least one of the module front surface 3a and the module rear surface 3b is in a state of being exposed from the main body portion, thereby ensuring that a temperature difference is generated between the module front surface 3a and the module rear surface 3b, are formed. In the thermoelectric conversion module disposing step, the thermoelectric conversion modules 3 are disposed in the embedding holes formed in the embedding hole forming step, and the positions of the disposed thermoelectric conversion modules 3 are fixed.

More specifically, in the embedding hole forming step, embedding holes are formed by respectively machining constituent components including the first skin material 1, the second skin material 2, and the honeycomb core 5. In the thermoelectric conversion module disposing step, the thermoelectric conversion modules 3 are disposed in the embedding holes formed in the constituent components, the positions of the disposed thermoelectric conversion modules 3 are fixed, and the main body portion is manufactured by assembling the constituent components to which the thermoelectric conversion modules 3 are fixed.

In the first embodiment, the honeycomb sandwich structure is manufactured as follows. Through holes are formed in the second skin material 2 as the embedding holes. Further, the thermoelectric conversion modules 3 are disposed in the through holes formed in the second skin material 2, whereupon the positions of the disposed thermoelectric conversion modules 3 are fixed. Furthermore, the main body portion is manufactured by assembling the second skin material 2 to which the thermoelectric conversion modules 3 are fixed, the first skin material 1, and the honeycomb core 5.

In an alternative method of manufacturing a honeycomb sandwich structure, as shown in FIG. 17, the main body portion in which the embedding holes are formed may be obtained in the embedding hole forming step, and then, in the thermoelectric conversion module disposing step, the thermoelectric conversion modules 3 may be disposed in the embedding holes formed in the main body portion and the positions of the disposed thermoelectric conversion modules 3 may be fixed.

The following two methods may be cited as examples of a method of manufacturing the main body portion in which the embedding holes are formed, as shown in FIG. 17.

A first method is as follows. In the embedding hole forming step, the main body portion is manufactured by assembling the constituent components including the first skin material 1, the second skin material 2, and the honeycomb core 5, whereupon the embedding holes are formed by machining the manufactured main body portion. As a result, the main body portion in which the embedding holes are formed, as shown in FIG. 17, is obtained.

A second method is as follows. In the embedding hole forming step, the constituent components including the first skin material 1, the second skin material 2, and the honeycomb core 5 are processed such that when the main body portion is manufactured, the embedding holes are formed therein, whereupon the main body portion is manufactured by assembling the processed constituent components. As a result, the main body portion in which the embedding holes are formed, as shown in FIG. 17, is obtained. Note that the first skin material 1 and the second skin material 2 are processed by end milling, for example. Further, shears, for example, are used to process the honeycomb core 5.

Note that when the thermoelectric conversion modules 3 are disposed in the embedding holes formed in the main body portion during the thermoelectric conversion module disposing step, the thermally conductive material 16 may be disposed in the embedding holes together with the thermoelectric conversion modules 3 so as to contact the module front surface 3a or the module rear surface 3b, whereupon the positions of the disposed thermoelectric conversion modules 3 and thermally conductive material 16 may be fixed. In so doing, the honeycomb sandwich structure according to the fifth embodiment is obtained.

In the method of manufacturing a honeycomb sandwich structure according to the seventh embodiment, the main body portion in which the embedding holes are formed is obtained in the embedding hole forming step, whereupon the thermoelectric conversion modules are disposed in the embedding holes formed in the main body portion in the thermoelectric conversion module disposing step. In contrast to the manufacturing method described in the first embodiment, therefore, there is no need to perform a thickness alignment process in advance to ensure that the skin material and the thermoelectric conversion modules are flush.

Note that although the first to seventh embodiments were described individually above, the example configurations disclosed respectively in the first to seventh embodiments may be combined as desired.

The invention claimed is:

1. A honeycomb sandwich structure comprising:
   a main body portion having a first skin material that includes a first front surface and a first rear surface opposing the first front surface, a second skin material that includes a second front surface and a second rear surface opposing the second front surface, and a honeycomb core that is adhered to both the first rear surface and the second rear surface so as to be sandwiched between the first skin material and the second skin material; and
   a thermoelectric conversion module that includes a high temperature side module front surface and a low temperature side module rear surface opposing the module front surface, and generates power using a temperature difference between the module front surface and the module rear surface, wherein
   the thermoelectric conversion module is embedded in at least one of the first and second skin materials of the main body portion such that at least one of the module front surface and the module rear surface is in a state of being exposed from the main body portion, and
   the thermoelectric conversion module is embedded in at least one of the first and second skin materials such that at least one of the module front surface and module rear surface is in a state of being exposed from the main body portion, and the other contacts the honeycomb core directly or via an adhesive layer.

2. The honeycomb sandwich structure according to claim 1, wherein the thermoelectric conversion module is embedded in the main body portion such that the module front surface in a state of being exposed from the main body portion is flush with the second front surface, whereas the module rear surface is in a state of not being exposed from the main body portion.

3. The honeycomb sandwich structure according to claim 2, further comprising a thermally conductive material that is embedded in the main body portion such that one surface of the thermally conductive material contacts the module rear surface and another surface of the thermally conductive material that opposes the surface contacting the module rear surface is in a state of being exposed from the main body portion.

4. The honeycomb sandwich structure according to claim 1, wherein the thermoelectric conversion module is embedded in the main body portion such that the module front surface in a state of being exposed from the main body portion is flush with the second front surface, and the module rear surface is in a state of being exposed from the main body portion.

5. The honeycomb sandwich structure according to claim 1, further comprising an auxiliary thermoelectric conversion module that includes a high temperature side auxiliary module front surface and a low temperature side auxiliary module rear surface opposing the auxiliary module front surface, and generates power using a temperature difference between the auxiliary module front surface and the auxiliary module rear surface, the auxiliary thermoelectric conversion module being embedded in the main body portion such that the auxiliary module rear surface is in a state of being exposed from the main body portion and the auxiliary module front surface is not in a state of being exposed from the main body portion.

6. The honeycomb sandwich structure according to claim 1, wherein the thermoelectric conversion module is embedded in the main body portion such that the module rear surface is in a state of being exposed from the main body portion and the module front surface is not in a state of being exposed from the main body portion.

7. The honeycomb sandwich structure according to claim 6, further comprising a thermally conductive material that is embedded in the main body portion such that one surface of the thermally conductive material contacts the module front surface and another surface of the thermally conductive material that opposes the surface contacting the module front surface is in a state of being exposed from the main body portion and is flush with the second front surface.

8. The honeycomb sandwich structure according to claim 1, wherein the honeycomb core is formed from carbon fiber reinforced plastic formed using pitch-based carbon fiber.

9. The honeycomb sandwich structure according to claim 1, wherein the other of the at least one of the module front surface and the module rear surface is located within the honeycomb core.

10. The honeycomb sandwich structure according to claim 1, wherein:
the module front surface is exposed from the main body portion and substantially flush with the first front surface, and
the module rear surface is exposed from the main body portion and substantially flush with the second front surface.

11. The honeycomb sandwich structure according to claim 1, comprising:
a thermally conductive material having a first side in contact with the other of the at least one of the module front surface and the module rear surface, the thermally conductive material extending into the honeycomb core.

12. The honeycomb sandwich structure according to claim 11, comprising:
the at least one of the module front surface and the module rear surface being exposed from the first skin material;
a second side of the thermally conductive material, located opposite the first side, being exposed from the second skin material.

13. The honeycomb sandwich structure according to claim 1, comprising:
a thermoelectric conversion module embedded in the each of the first and second skin materials such that the thermoelectric conversion module in the first skin material does not overlap with the thermoelectric conversion module in the second skin material in a plan view of the first and second skin materials.

14. A method of manufacturing a honeycomb sandwich structure including:
a main body portion having a first skin material that includes a first front surface and a first rear surface opposing the first front surface, a second skin material that includes a second front surface and a second rear surface opposing the second front surface, and a honeycomb core that is adhered to both the first rear surface and the second rear surface so as to be sandwiched between the first skin material and the second skin material; and
a thermoelectric conversion module that includes a high temperature side module front surface and a low temperature side module rear surface opposing the module front surface, and generates power using a temperature difference between the module front surface and the module rear surface, the method comprising:
an embedding hole forming step for forming an embedding hole for embedding the thermoelectric conversion module in at least one of the first and second skin materials of the main body portion such that at least one of the module front surface and the module rear surface is in a state of being exposed from the main body portion;
a thermoelectric conversion module disposing step for disposing the thermoelectric conversion module in the embedding hole and fixing a position of the disposed thermoelectric conversion module; and
an embedding step of for embedding the thermoelectric conversion module in at least one of the first and second skin materials such that at least one of the module front surface and module rear surface is in a state of being exposed from the main body portion, and the other contacts the honeycomb core directly or via an adhesive layer.

15. The method of manufacturing a honeycomb sandwich structure according to claim 14, wherein
in the embedding hole forming step, the embedding hole is formed by respectively processing constituent components including the first skin material, the second skin material, and the honeycomb core, and
in the thermoelectric conversion module disposing step, the thermoelectric conversion module is disposed in the embedding hole formed in the constituent components, the position of the disposed thermoelectric conversion module is fixed, and the main body portion is manufactured by assembling the constituent components to which the thermoelectric conversion module is fixed.

16. The method of manufacturing a honeycomb sandwich structure according to claim 14, wherein
in the embedding hole forming step, the main body portion is manufactured by assembling constituent components including the first skin material, the second skin material, and the honeycomb core, and the embedding hole is formed by processing the manufactured main body portion, and
in the thermoelectric conversion module disposing step, the thermoelectric conversion module is disposed in the embedding hole formed in the main body portion, and the position of the disposed thermoelectric conversion module is fixed.

17. The method of manufacturing a honeycomb sandwich structure according to claim 14, wherein in the embedding hole forming step, constituent components including the first skin material, the second skin material, and the honeycomb core are processed such that when the main body portion is manufactured, the embedding hole is formed therein, whereupon the main body portion is manufactured by assembling the processed constituent components, and in the thermoelectric conversion module disposing step, the thermoelectric conversion module is disposed in the embedding hole formed in the main body portion, and the position of the disposed thermoelectric conversion module is fixed.

18. A honeycomb sandwich structure comprising:

a main body portion having a first skin material that includes a first front surface and a first rear surface opposing the first front surface, a second skin material that includes a second front surface and a second rear surface opposing the second front surface, and a honeycomb core that is adhered to both the first rear surface and the second rear surface so as to be sandwiched between the first skin material and the second skin material; and a first thermoelectric conversion module including a high temperature side surface and a low temperature side surface opposing the high temperature side surface, wherein the first thermoelectric conversion module is embedded in one of the first and second skin materials such that at least one of a first front surface of the module and a first rear surface of the module is in a state of being exposed from the main body portion, and the other contacts the honeycomb core directly or via an adhesive layer.

19. The honeycomb sandwich structure according to claim 18, comprising:

a second thermoelectric conversion module embedded in the other of the first and second skin materials and located, in a plan view of the other of the first and second skin materials, so as to not overlap with the first thermoelectric conversion module.

20. The honeycomb sandwich structure according to claim 18, comprising:

a plurality of first thermoelectric conversion modules embedded in the first skin material, and a plurality of second thermoelectric conversion modules embedded in the second skin material, wherein the first thermoelectric conversion modules are arranged, in a plan view of the first and second skin materials, so as to not overlap with the second thermoelectric conversion modules.

* * * * *